United States Patent
Matsumoto et al.

(10) Patent No.: US 7,015,761 B2
(45) Date of Patent: Mar. 21, 2006

(54) POWER AMPLIFIER MODULE

(75) Inventors: Hidetoshi Matsumoto, Kokubunji (JP);
Tomonori Tanoue, Machida (JP);
Satoshi Tanaka, Kokubunji (JP); Kiichi Yamashita, Shiroyama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/975,431

(22) Filed: Oct. 29, 2004

(65) Prior Publication Data

US 2005/0088236 A1    Apr. 28, 2005

Related U.S. Application Data

(63) Continuation of application No. 10/753,484, filed on Jan. 9, 2004, now Pat. No. 6,822,517, which is a continuation of application No. 10/239,157, filed on Nov. 21, 2002, now Pat. No. 6,710,649.

(30) Foreign Application Priority Data

Mar. 31, 2000    (JP) ............................. 2000-101205

(51) Int. Cl.
    *H03F 3/68*    (2006.01)
    *H03G 3/20*    (2006.01)

(52) U.S. Cl. .................. 330/295; 330/124 R; 330/136

(58) Field of Classification Search ................ 330/295, 330/124 R, 136, 296
See application file for complete search history.

(56) References Cited

U.S. PATENT DOCUMENTS

| | | | |
|---|---|---|---|
| 4,412,245 A | 10/1983 | Kwok | |
| 5,311,143 A | 5/1994 | Soliday | |
| 5,371,477 A | 12/1994 | Ikeda et al. | |
| 5,564,092 A | 10/1996 | Grandfield et al. | |
| 5,629,648 A | 5/1997 | Pratt | |
| 5,923,217 A | 7/1999 | Durec | |
| 6,333,677 B1 | 12/2001 | Dening | |
| 6,472,937 B1 | 10/2002 | Gerard et al. | |
| 6,545,541 B1 | 4/2003 | Pehlke et al. | |

FOREIGN PATENT DOCUMENTS

JP        A-7-154169        6/1995

*Primary Examiner*—Patricia Nguyen
(74) *Attorney, Agent, or Firm*—Antonelli, Terry, Stout & Kraus, LLP.

(57) ABSTRACT

A CDMA system is provided which includes a power amplifier module have a DC current amplifier. The DC and current amplifier detects a DC component of an input signal and amplifies this detected DC component. The power amplifier module also includes an amplifier which receives the current amplified by the DC current amplifier as an input current. The input signal supplied to the DC current amplifier changes in response to an input power level.

12 Claims, 7 Drawing Sheets

US 7,015,761 B2

POWER AMPLIFIER MODULE

CROSS-REFERENCE TO RELATED APPLICATIONS

This application is a Continuation of application Ser. No. 10/753,484, filed Jan. 9, 2004, which is a Continuation of application Ser. No. 10/239,157 (now U.S. Pat. No. 6,710, 649), filed Sep. 20, 2002, which is a National Stage Application filed under 35 U.S.C. § 371 of International (PCT) Application No. PCT/JP01/02739, filed Mar. 30, 2001, the contents of which are hereby incorporated by reference in their entirety.

TECHNICAL FIELD

The present invention relates to a power amplifier, module designed for a portable terminal unit used in a mobile communication system. More specifically, the present invention is related to a power amplifier module designed for a cellular telephone system requiring a high efficiency and high linearity.

BACKGROUND ART

As conventional techniques related to power amplifier modules, there are JP-A-7-154169 and U.S. Pat. No. 5,629, 648.

Very recently, while mobile communication markets typically known as cellular telephone systems are considerably expanded, new communication systems such as the broadband CDMA system and the EDGE system have been conducted. In such systems, high efficiencies and high linearity of portable terminal units are required. In particular, as to power amplifier modules which constitute one of major electronic components of terminal units, there is such a serious problem that these contradicting performance requirements are realized at the same time. Conventionally, many attempts have been made so as to solve this problem. As a typical example, in general, one control system has been proposed. In this system, an input power level of a power amplifier module is detected, and then, an operation condition of a post-stage amplifier which constitutes the power amplifier module is controlled by this signal. For instance, in a prior-investigated technical example shown in FIG. 3, a gate voltage of a transistor 111 which constitutes a post-stage amplifier 101 is controlled based upon a DC voltage obtained by envelope-detecting and smoothing an output signal of a pre-stage amplifier 102 in a DC voltage generating circuit 103 which is arranged by a directional coupling device 106, a detecting diode 107, and a low-pass filter 108. The DC voltage is increased/decreased in response to a power level inputted into a terminal 104, namely, a gate voltage of the post-stage amplifier 101 is controlled in response to the input power level. Also, in a prior-investigated technical example shown in FIG. 4, a power supply current of a first amplifier 201 is detected by a power supply voltage control circuit 203, and a power supply voltage corresponding to this current value is generated so as to control a power supply voltage of a second amplifier 202. Since the power supply current of the first amplifier 201 is changed in correspondence with a level of power inputted into a terminal 204, the power supply voltage of the second amplifier 202 is controlled in response to the input power level.

In the above-explained prior-investigated technical example, the DC voltage generating circuit 103 is required in order to envelope-detect and smooth the output power level of the pre-stage amplifier 102. However, since this DC voltage generating circuit 103 must be separately provided with reference to the amplifiers 101 and 102, there is such a problem that the stable characteristic of this DC voltage generating circuit 103 can be continuously and hardly guaranteed without any adjustment with respect to variations of environment conditions such as manufacturing deviation and ambient temperatures, and also power supply voltages. Furthermore, since the DC voltage generating circuit 103 is constituted by such components having different characteristics as the directional coupling device 106, the detecting diode 107, and the low-pass filter 108, there is another problem that the DC voltage generating circuit 103, and the amplifiers 101, 102 can be hardly formed in an integrated circuit.

In the prior-investigated technical example of FIG. 4, the DC-to-DC converter is required to be employed as the power supply voltage control circuit 203 for controlling the second amplifier 202. However, there are such problems that the use of such a DC-to-DC converter may constitute a factor of impeding the integrating manufacture of electronic components, and furthermore, the module is made bulky as well as the manufacturing cost is increased.

Also, the circuit system disclosed in the above-described U.S. Pat. No. 5,629,648 corresponding to the prior art may be considered. In this circuit system, since the output of the reference transistor, namely, the voltage at the bias point corresponding to the base input of the main transistor is not substantially changed in connection with the change in the input amplitudes, there is a problem that the output of the reference transistor can hardly give effectively influences to up/down of the operating point of the main transistor.

DISCLOSURE OF THE INVENTION

An object of the present invention is to solve the problems of the above-described prior art and also the problems of the above-explained prior-investigated technical examples, and is to provide a low-cost power amplifier module which owns a high efficiency and a high linear characteristic, and further, can be easily manufactured in an integrated circuit form.

To achieve the above-described object, a power amplifier module, according to the present invention, is featured by that a reference amplifier is newly employed which simulates operations of respective stages of amplifiers for constituting the power amplifier module, a current flowing through an input terminal of this reference amplifier in response to an input power level is detected/amplified, and then, the detected/amplified current can be supplied as an input current of the above-described amplifiers.

In the present invention, an input signal is supplied via individual capacitors to the reference amplifier and the respective stage amplifiers. At this time, although the current responding to the input power level flows through the input terminal of the reference amplifier, no current flow through the input terminals of the respective stage amplifiers. Therefore, if a DC component of the input current of the reference amplifier is detected and amplified, and the detected/amplified DC component current is supplied to the input terminals of the respective stage amplifiers, then the respective stage amplifiers commence high frequency operations. When the input power level is increased, the input current of the reference amplifier is increased, so that the input currents supplied to the respective stage amplifiers are also increased. Conversely, when the input power level is lowered, the input current of the reference amplifier is decreased, so that the input currents supplied to the respective stage amplifiers are also decreased. In other words, since the operating point corresponding to the input power can be set, even when the small input power is supplied, a relatively high efficiency can be obtained.

BEST MODE FOR CARRYING OUT THE INVENTION

Figure 1:
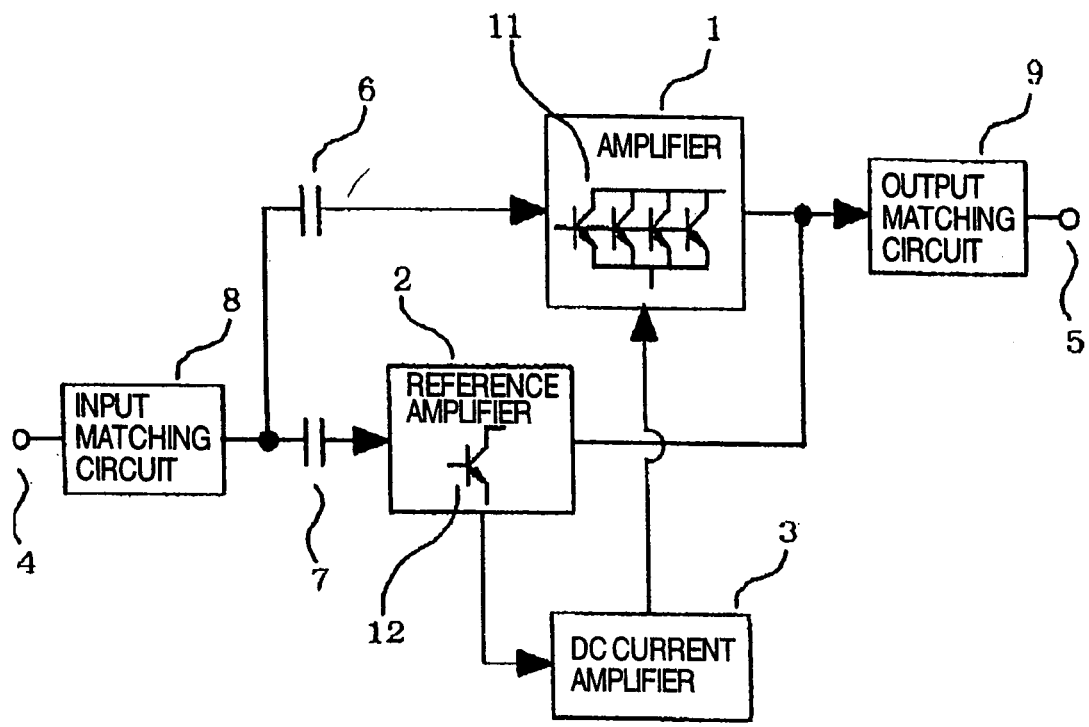
FIG. 1 is a diagram for showing one embodiment of the present invention.

In general, a power amplifier module is arranged by employing either two stages or three stages of unit amplifiers. FIG. 1 represents an embodiment of unit amplifiers which constitute a power amplifier module according to the present invention. The unit amplifier of this embodiment is constituted by an amplifier 1 for power-amplifying an input signal, a reference amplifier 3, a DC current amplifier 3, input/output matching circuits 8 and 9, and also, coupling capacitors 6 and 7. The reference amplifier 2 produces a DC component of an input current in correspondence with a level of input power. The DC current amplifier 3 amplifies this DC current component, and then supplies this current-amplified DC component to the amplifier 1. In this case, in such a case that a dimension ratio of a transistor 11 to another transistor 12 is equal to n:1, which constitute both the amplifier 1 and the reference amplifier 2, a current amplification factor of the DC current amplifier 3 is set to be larger than, or equal to "n." The larger this current amplification factor is increased, the larger a distortion reducing effect achieved when a large output current is outputted is increased. As a result, the current amplification factor is set in such a manner that this current amplification factor is fitted to a target value of reducing distortion at a design stage. In this embodiment, while both the reference amplifier 2 and the amplifier 1 are arranged in such a way that the input/output matching circuits 8 and 9 are commonly used by these amplifiers 2 and 1, the operation condition of the amplifier 1 is substantially equal to the operation condition of the reference amplifier 2, so that a high linear characteristic (high linearity) may be obtained. Also, since the transistors 11 and 12 which constitute both the amplifier 1 and the reference amplifier 2 are manufactured on the same chip, the linearity may be maintained even in such a case that manufacturing deviation occurs and environment conditions are changed. It should be noted that an Si bipolar transistor, GaAs-HBT, SiGe-HBT, and the like may be employed as these transistors 11 and 12.

Next, operations of the above-described embodiment will now be described. A signal inputted from the terminal 4 is transferred via the coupling capacitors 6 and 7 to the amplifier 1 and the reference amplifier 2. The input signal is amplified by the reference amplifier 2. At this time, a DC component is produced in the input current of this reference amplifier 2 because of a non-linear operation of the transistor 12 which constitutes this reference amplifier 2. Since this DC component is changed in response to a level of input power in an one-to-one correspondence, if this DC component is detected, then a value of an input current which should be supplied to the amplifier 1 can be grasped. Since the dimension of the transistor 11 is larger than the dimension of the transistor 12, the DC current detected by the reference amplifier 2 is amplified by the DC current amplifier 3, and thereafter, the amplified DC current is supplied by the DC current amplifier 3 as an input current of the amplifier 1. When the current is supplied from the DC current amplifier 3, the amplifier 1 commences to be operated. In an actual case, both the amplifier 2 start their operations at the substantially same time. The input current of the amplifier 1 is changed in a dynamic manner in response to the input power level by the above-described operation mechanism. When the input power level is high, this input current is increased, and the operating point of the transistor 11 of the amplifier 1 is automatically set to be high. As a result, the amplifier 1 can perform the power amplification with low distortion. Also, conversely, when the level of the input power is low, the input current is decreased, and thus, the operating point of the transistor 11 of the amplifier 1 is lowered. As a result, useless power consumption can be reduced, and lowering of the power efficiency within the region where the input power level is low can be reduced.

Figure 2:
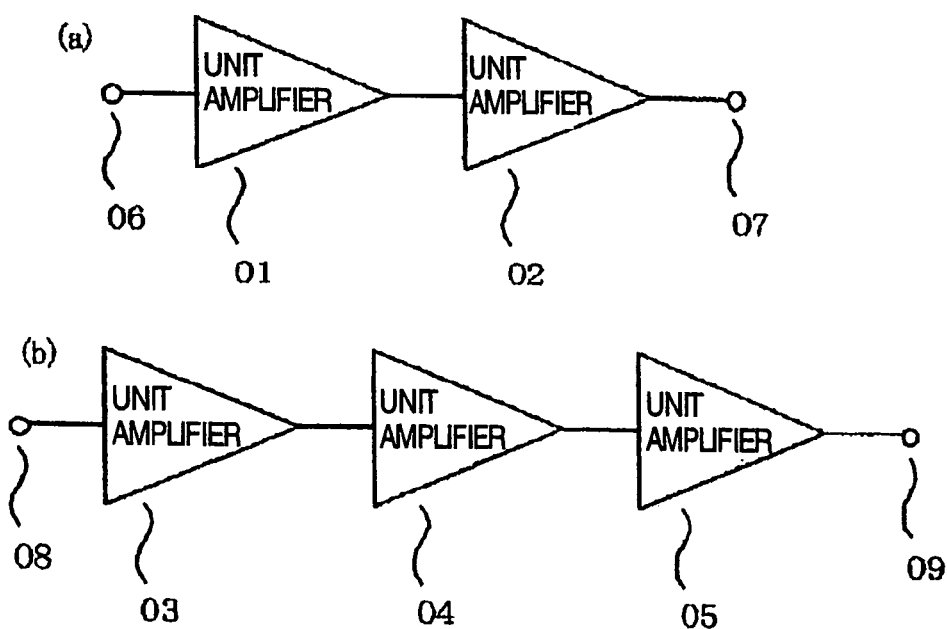
FIG. 2 is a diagram for representing one embodiment of the present invention.
Figure 3:
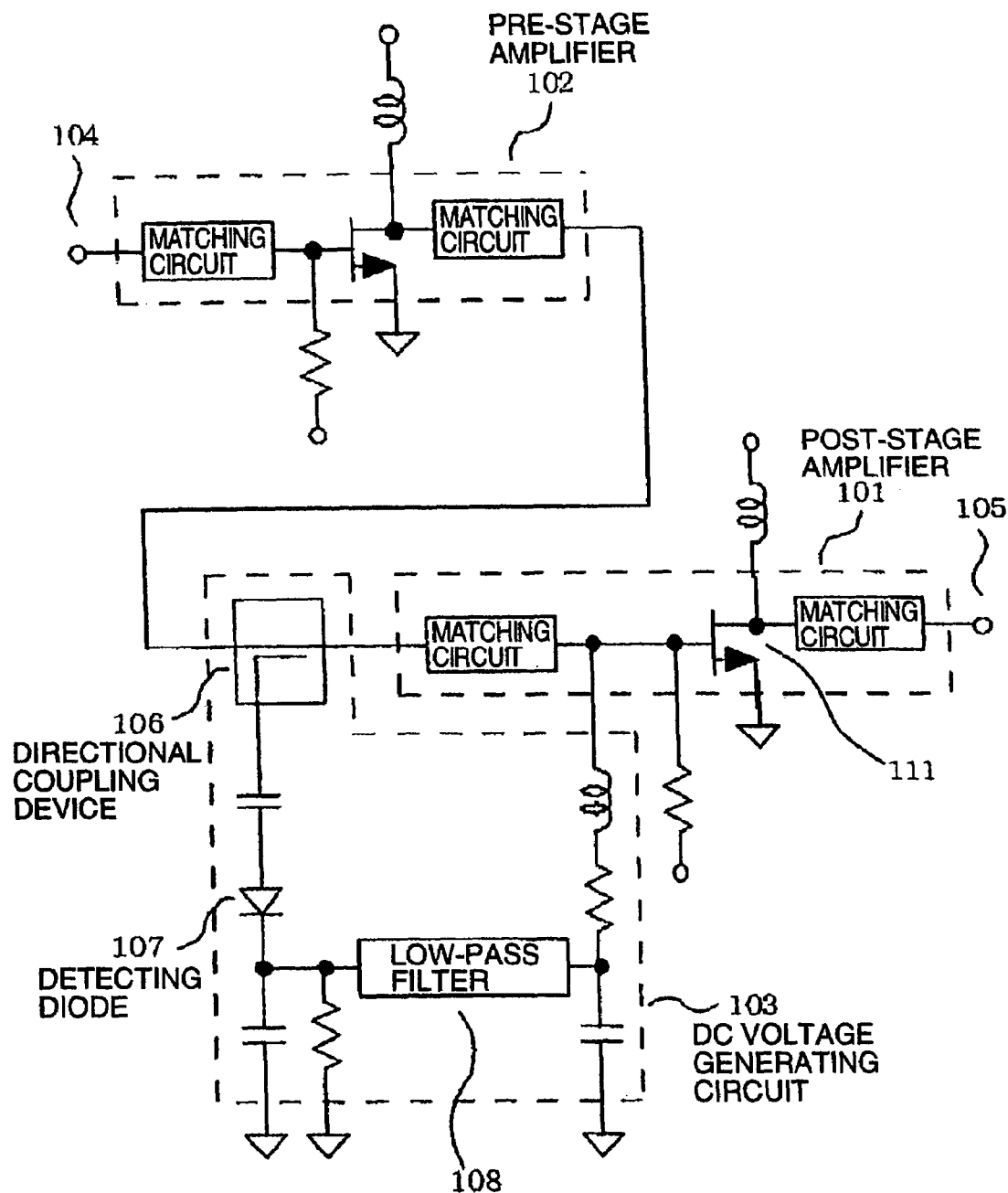
FIG. 3 is a diagram for indicating an example of the prior-investigated technique.
Figure 4:
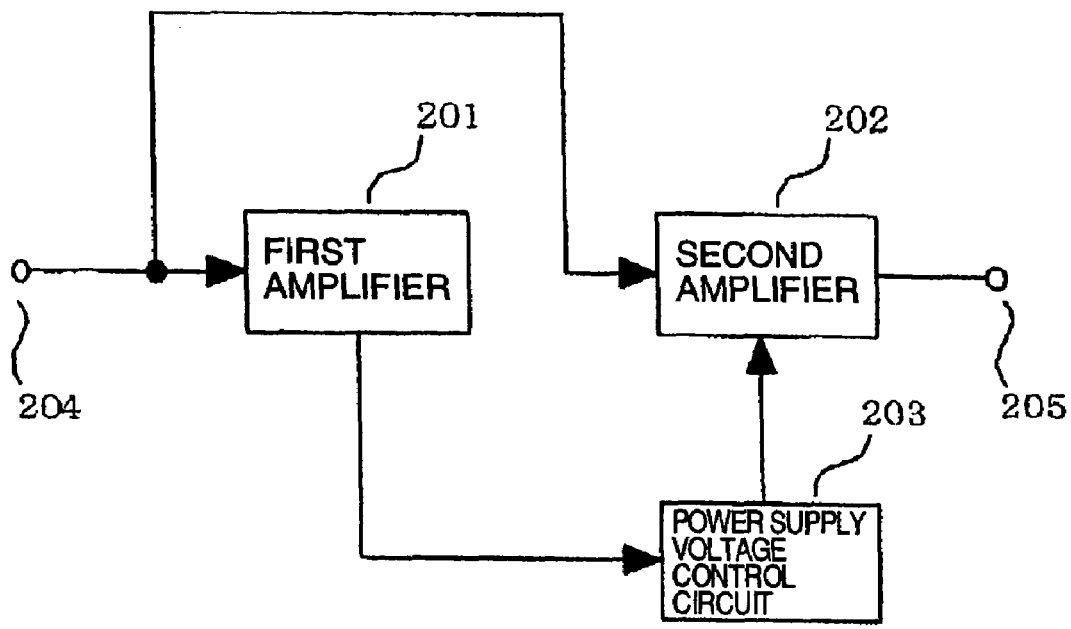
FIG. 4 is a diagram for indicating an example of the prior-investigated technique.

FIG. 2(a) and FIG. 2(b) indicate an embodiment of both two stages and three stages of power amplifier modules, respectively, which are constituted by employing the unit amplifier shown in FIG. 1. The two-stage power amplifier module is applied many times to a CDMA system, a PDC system, and the like, whereas the three-stage power amplifier module is applied many times to a GSM system, and the like. Signals entered from a terminal 06 and another terminal 08 are sequentially power-amplified by either unit amplifiers 01, 02 or unit amplifiers 03, 04, 05 in accordance with the operations explained in FIG. 1, and then, the power-amplified signals are outputted from a terminal 07, and another-terminal 09, respectively. Therefore, in FIG. 2(a) and FIG. 2(b), since the electric power during operation is increased in this order of the unit amplifiers 01<02, and of the unit amplifiers 03<04<05, dimensions of transistors which constitute the unit amplifiers 01, 02, and the unit must be changed based upon power distributions which are allocated from the system specification. For instance, in post-stage amplifiers, especially, in final-stage amplifiers, since an electric power level thereof becomes higher than an electric power level of a pre-stage amplifier, such a transistor having the largest dimension is used. It should also be noted that input/output matching circuits among the respective unit amplifiers may be commonly used by way of a design changed. In this alternative case, there is such a merit that the entire unit amplifier may be made compact. In the foregoing description, the input current of the amplifier 1 is supplied by that the input current of the reference amplifier 2 is supplied and amplified. Alternatively, instead of the input current of the reference amplifier 2, such a current which is obtained by detecting a power supply current to amplify this detected power supply current may be supplied to the base of the amplifier 1. In this alternative case, instead of the base current of the transistor 12, the collector current thereof may be utilized.

Figure 5:
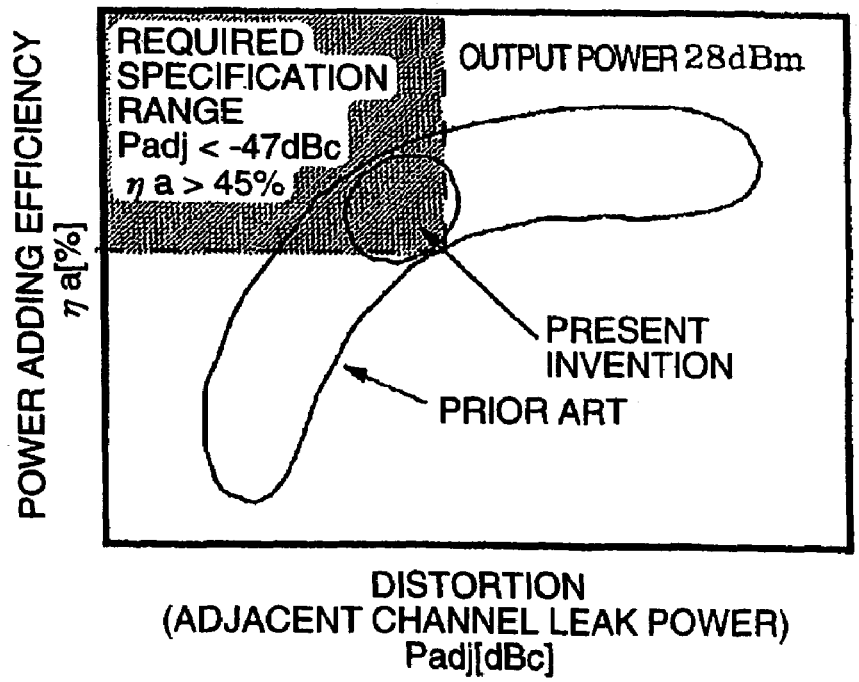
FIG. 5 is a diagram for representing manufacturing deviation of one embodiment according to the present invention.

FIG. 5 represents manufacturing deviation of a power amplifier module which was manufactured as a trial module based upon this embodiment. Output power is 28 dBm. In this drawing, an abscissa indicates adjacent channel leak power corresponding to an index of distortion, and an ordinate shows a power adding efficiency, and the manufacturing deviation of the power amplifier module is indicated by an area surrounded by a solid line. For the sake of easy comparisons, manufacturing deviation of the prior-investigated technical idea is also indicated in this drawing. An area indicated by a hatched line shows a range of a required specification. In the prior-investigated technical idea, a good product acquiring rates of power amplifier modules which may satisfy the required specification is smaller than, or equal to 10%, whereas a good product acquiring ratio of the power amplifier modules which may satisfy the required specification according to this embodiment is improved up to 90%.

Figure 6:
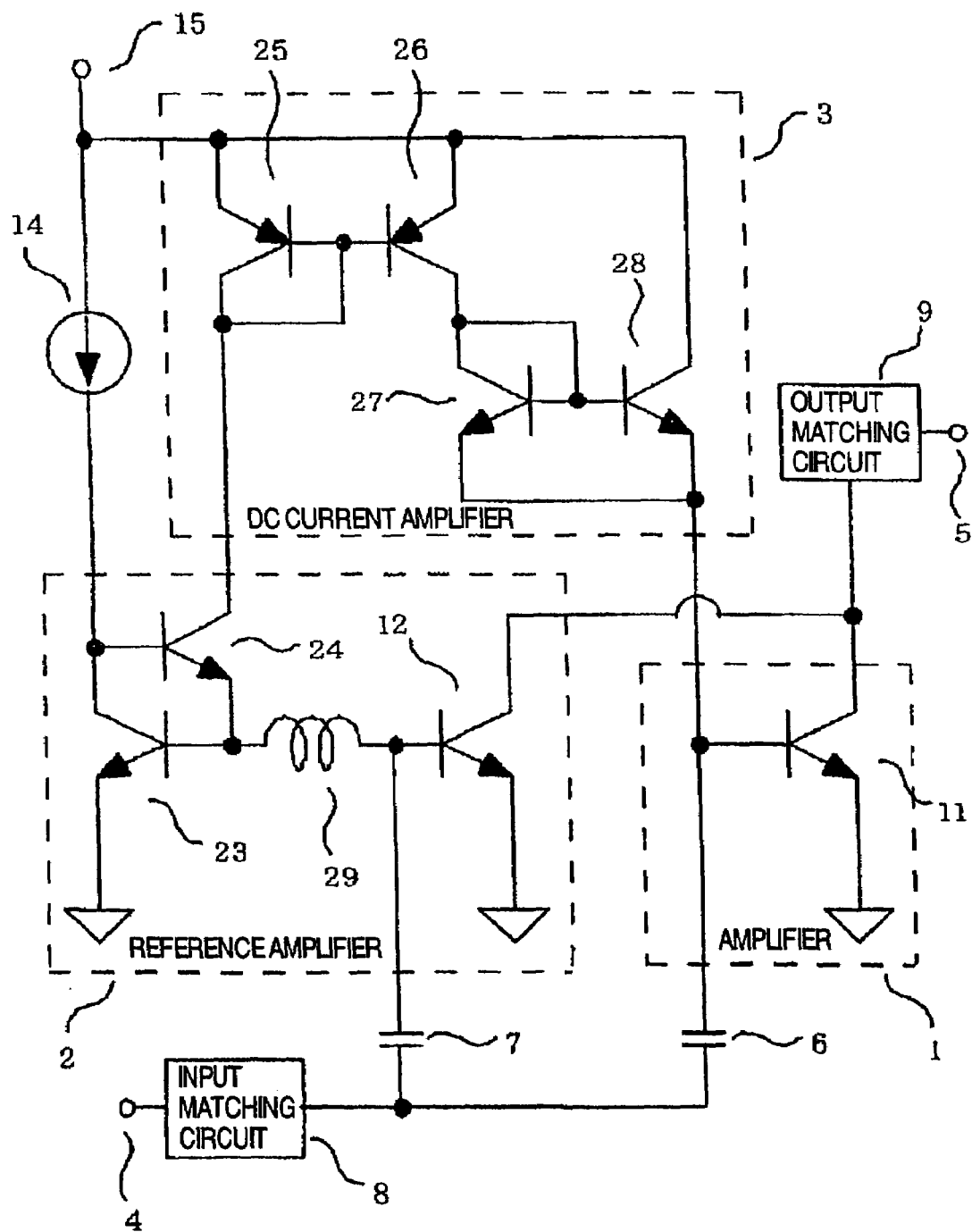
FIG. 6 is a diagram for showing a circuit arrangement of one embodiment of the present invention.

FIG. 6 indicates an embodied (exemplified) structure of a unit amplifier, according to an embodiment of the present invention. First, a description will now be made of operations of this unit amplifier during no signal. In this case, a collector current flowing through a transistor 12 is determined based upon a current supplied by a constant current source 14 to a transistor 23, since both the transistor 12 and the transistor 23 constitute a current mirror circuit. For example, if a dimension ratio of the transistor 12 to the transistor 23 is selected to be m:1, then a collector current of the transistor 12 becomes "m" times larger than the current supplied from the constant current source 14. When the collector current flows through the transistor 12, such a current defined by 1/current amplification factor will flow through this transistor 12. This current flows via a transistor 24 into a transistor 25, and then, is transferred to a transistor 26 which constitutes a current mirror circuit in connection with the transistor 25. Eventually, this current flowing through the transistor 26 is supplied as a base current of a transistor 11, and may determine an operating point of the transistor 11 under non-signal condition. In this case, both a transistor 27 and another transistor 28 constitute a current mirror circuit, and owns a current amplifying function capable of supplying a large current which is required in such a case that the transistor 11 is constituted by connecting, for example, 100 to 200 pieces of unit transistors in a parallel manner. In general, a current supplying capability of a PNP transistor is small, so that a dimension of this PNP transistor becomes very large in order to supply a large current. As a result, if the current amplifying function of the transistors 27 and 28 is utilized, then the dimension of the transistor 26 can be made small. Next, a description will now be made of operations under such a condition that a signal is inputted to this unit amplifier. In this case, firstly, a signal is supplied via the coupling capacitors 6 and 7 to the transistors 11 and 12. Since the transistor 12 owns the non-linear characteristic, a DC component is produced in the base current. This current having the DC component flows to the transistor 24 via a high-frequency cut-off inductor 29. At this time, while a base current corresponding to an input signal is not supplied to the transistor 24, the current flowing through the transistor 24 is supplied via the transistors 25, 26, 27, and 28 in a manner similar to that when no signal is entered, and thereafter, operation is commenced. Since the base current value of the transistor 12 is changed in response to the level of the input power, the base current of the transistor 11 is also changed in response to this change in the input power level, and the operating point when the signal is inputted is automatically set.

As the specific effect of this embodiment, a thermal run-away suppressing effect may be achieved. For instance, in the case that output power of 36 dBm (4 W) is required as in a power amplifier module designed for the GSM system, a large-scaled transistor manufactured by connecting 100 to 200 pieces of unit transistors in parallel manner is employed as the transistor 11. When such a large-scaled transistor is arranged in high density within a chip, a thermal resistance is increased. In the normal case, when a thermal resistance of a bipolar transistor is increased, a thermal run-away easily happens to occur, so that there is a limitation in reducing of a chip area. While an easy occurrence of a thermal run-away may depend upon a current supplying capability of a base bias circuit other than a thermal resistance, since such a bias circuit having a large current supplying capability as a constant voltage bias circuit is employed in a normal power amplifier module, a thermal run-away easily occurs. When high power is outputted in a power amplifier module, a thermal run-away may readily occur. In this embodiment, however, since a current supplied to the transistor 11 is limited by the input power level, the power amplifier module is arranged in such a manner that a thermal run-away can hardly occur. As a result, in this embodiment, the chip area can be reduced, so that the power amplifier module can be made compact.

It should also be noted that in the embodiment of FIG. 6, the transistors 11, 12, 23, 24 may be constructed of GaAs-HBTs, and the transistors 25, 26, 27, 28 may be constituted by either Si bipolar transistors or MOS transistors. Furthermore, the inductor 29 may be replaced by either a resistor, or a series-connection of a resistor and an inductor.

Figure 7:
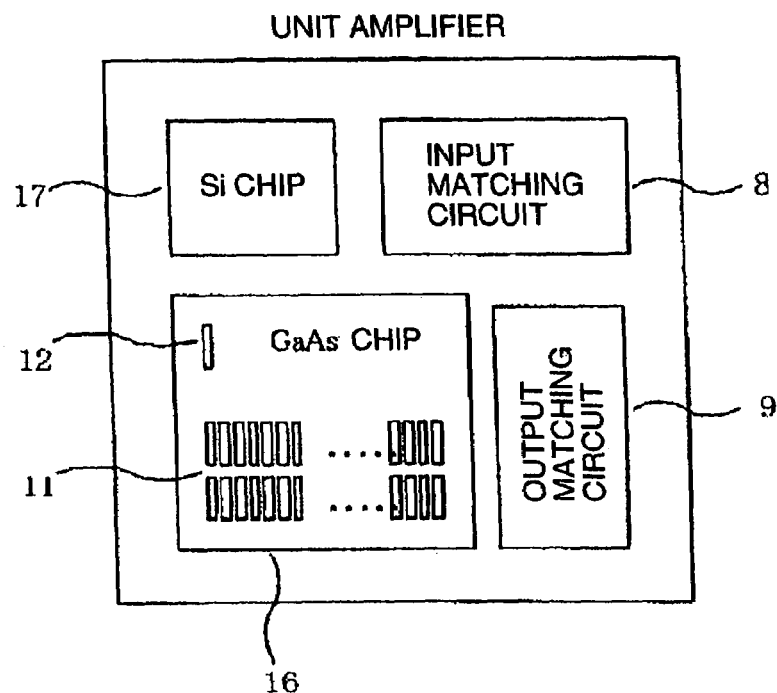
FIG. 7 is a diagram for indicating a packaging condition of one embodiment of the present invention.

FIG. 7 shows a component arrangement of the unit amplifier according to this embodiment. This drawing indicates such an example that both the amplifier 1 and the unit amplifier 2 shown in FIG. 6 are formed on a GaAs chip 16, and the DC current amplifier 3 shown in FIG. 6 is formed on an Si chip 17 in an integrated circuit manner. The unit amplifier is constituted by these chips 16, 17, and the input/output matching circuits 8, 9 which are mounted on a module board. As previously explained, in accordance with the present invention, the major components of the unit amplifier are formed in the integrated circuit form, so that a total number of electronic components thereof can be reduced and the module can be made compact. Also, since the transistor 11 and the transistor 12 are manufactured on the same chip, these transistors 11 and 12 may have a superior pair characteristic, and thus, may be operated under stable condition without being adversely influenced by manufacturing deviation and environment variations. It should be understood that in order to effectively achieve the above-described thermal run-away suppressing effect, as indicated in FIG. 7, the transistor 11 and the transistor 12 are manufactured by being separated from each other. AS a result, the transistor 12 can be hardly influenced by adverse influences of heat of the transistor 11.

Figure 8:
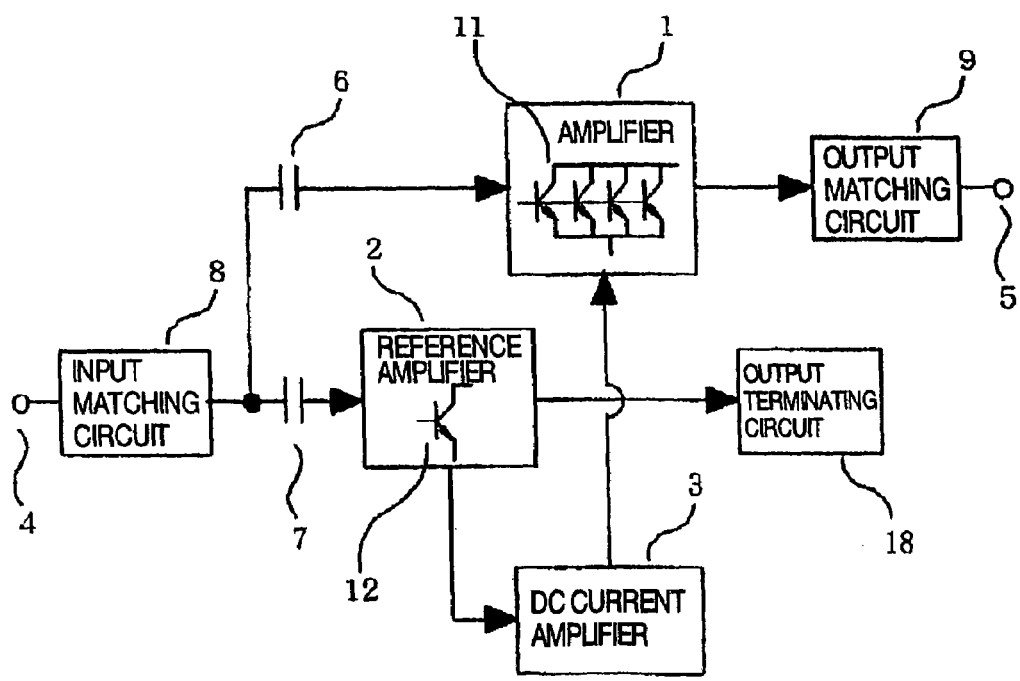
FIG. 8 is a diagram for showing one embodiment of the present invention.

FIG. 8 shows a-unit amplifier according to another embodiment of the present invention. This embodiment owns a different point that an output terminating circuit 18 is provided so as to terminate an output of a reference amplifier 2 within the module, as compared with the module of FIG. 1. Since the output of the reference amplifier 2 is cut out from the output terminal 5, an operation of the reference amplifier 2 can be hardly influenced by a load. Since an operation current of the amplifier 1 is controlled by the reference amplifier 2, an operation of this amplifier 1 can also be hardly influenced by the load. As a direct effect of the above-explained operation, a load variation withstanding characteristic may be improved. In portable terminal units, destruction of antennas and contacts of these antennas to metals may occasionally occur when these portable terminal units are used, while these antennas constitute loads of power amplifier modules. In such a case, since matching conditions between the power amplifier modules and the antennas are broken, large standing waves are produced due to power reflections. Accordingly, the power amplifier modules may be readily destroyed. In this embodiment, even when reflection power occurred from an antenna is increased, since the operation current of the amplifier 1 can be hardly changed, it is possible to avoid the breakdown of the amplifier 1.

Figure 9:
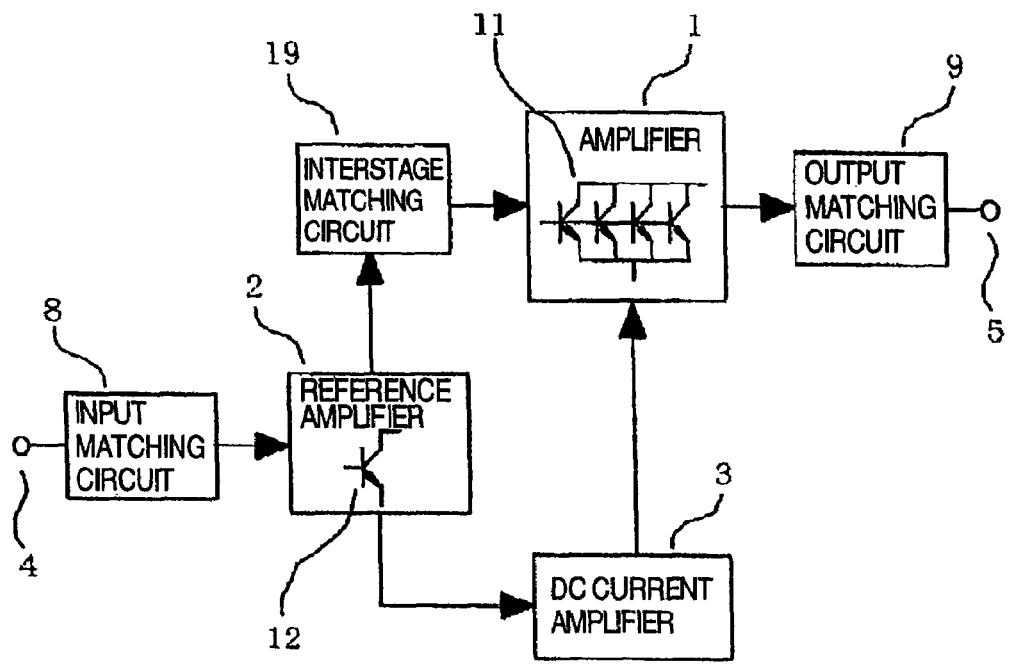
FIG. 9 is a diagram for showing one embodiment of the present invention.

FIG. 9 indicates a unit amplifier according to another embodiment of the present invention. This embodiment owns such a different structure from that of FIG. 1. That is, an interstage matching circuit 19 is provided, and an output of a reference amplifier 2 is connected to an input of an amplifier 1. This unit amplifier is arranged by a two-stage amplifier, and a pre-stage amplifier may also function as a reference amplifier. As a result, the reference amplifier need not be separately provided, but a structure of a module can be made simple. Since the reference amplifier 2 is separated from the output terminal 5 by the amplifier 1, there is such a merit that this unit amplifier can be hardly influenced by the load variation similar to that of FIG. 8.

Figure 10:
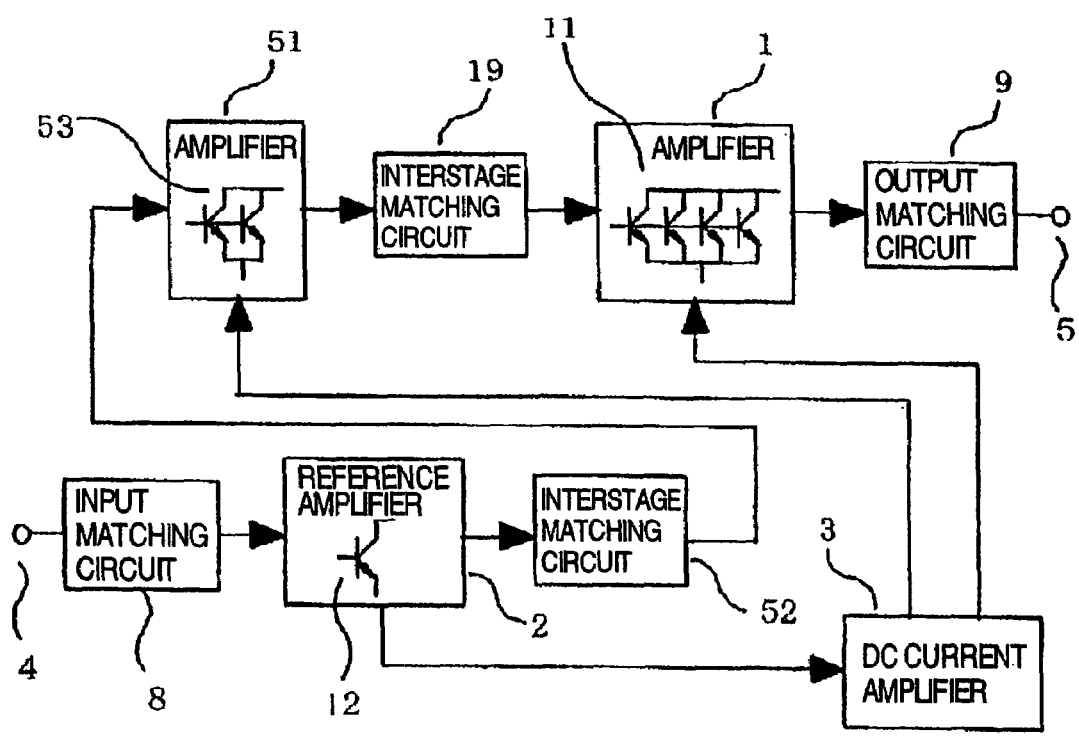
FIG. 10 is a diagram for showing one embodiment of the present invention.

FIG. 10 indicates a unit amplifier related to a 3-stage power amplifier module, according to another embodiment of the present invention. This embodiment owns a different point from that of FIG. 9. That is, both an amplifier 51 and an interstage matching circuit 52 are additionally provided in the unit amplifier of FIG. 9. Similar to FIG. 9, in this embodiment, while a first-stage amplifier is also operated as a reference amplifier 2, both a second-stage amplifier 51 and a third-stage amplifier 1 are controlled. In this case, since the reference amplifiers of the respective stages can be omitted, there is a merit that the structure of the unit amplifier can be made simple.

Figure 11:
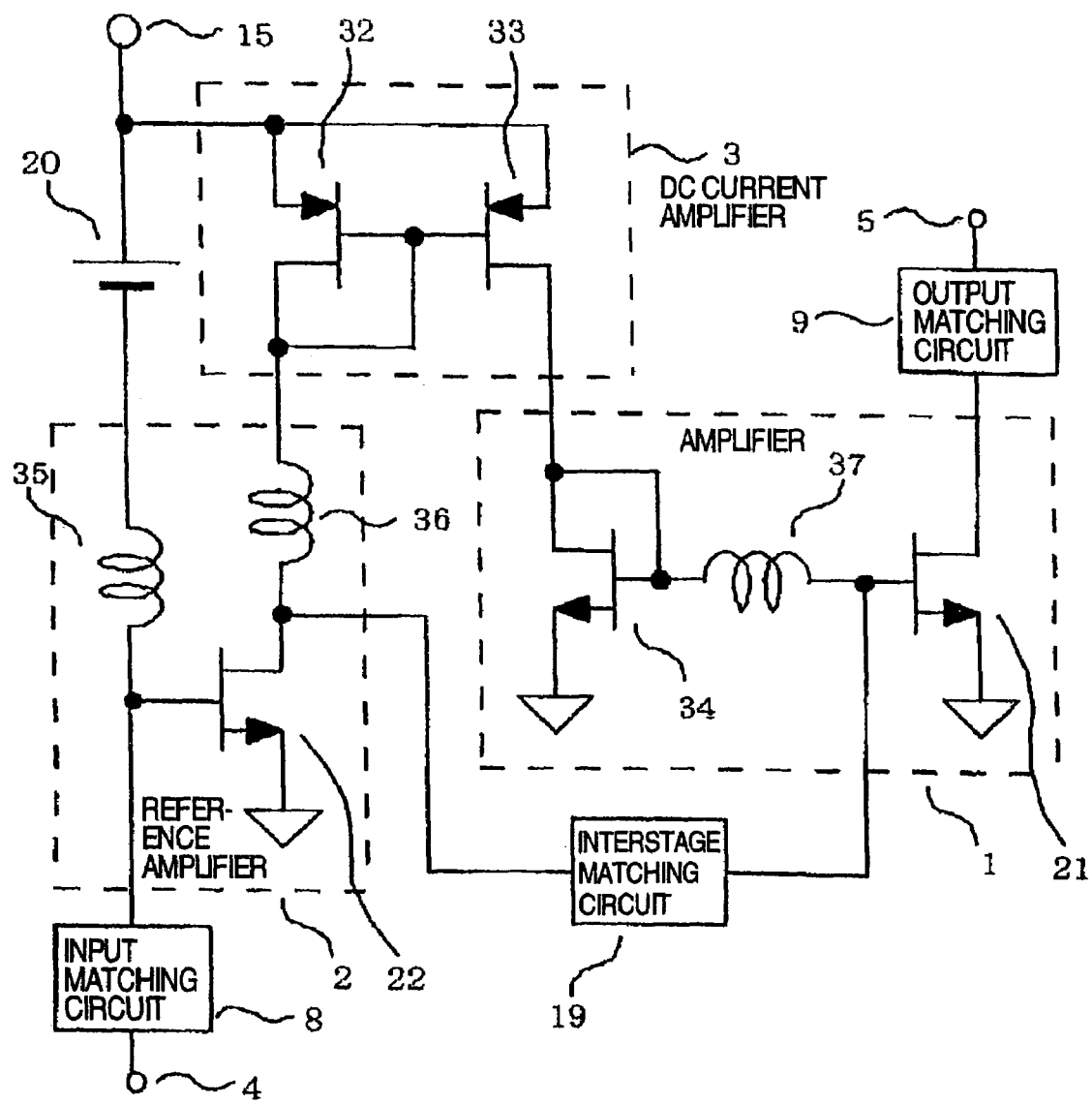
FIG. 11 is a diagram for representing a circuit arrangement of one embodiment of the present invention.

FIG. 11 indicates a unit amplifier according to another embodiment of the present invention. This embodiment is an application example in which the unit amplifier is applied to a field-effect transistor. A basic structure of amplifier is identical to that of the embodiment shown in FIG. 9. Only such a point is different. That is, field-effect transistors 21 and 22 are employed instead of the bipolar transistors 11 and 12. In this embodiment, a DC component of a drain current of the field-effect transistor 22 is detected. An output of a DC current amplifier 3 is converted into a voltage by a transistor 34, and then, this converted voltage is applied to a gate of the field-effect transistor 21. Such a technical point that an operating point is automatically set in response to input power, and thus, a low-distortion/high-efficiency operation with superior reproducibility can be realized is similar to that of the above-described embodiment.

In accordance with the structures of the present invention, since the same sorts of transistors which constitute the reference amplifier and the respective stage amplifiers may be employed, these amplifiers can be readily formed in the integrated circuit, and an external specific circuit is no longer required. Also, since the reference amplifier and the respective stage amplifiers are formed on the same chip in the integrated circuit form, this reference amplifier may be operated in a substantially same manner to that of the respective stage amplifiers in the high frequency mode as well as the DC mode. As a consequence, even when the manufacturing deviation of the transistors is present and the environment conditions are varied, the stable characteristic can be continuously obtained without any adjustment. Furthermore, since both the reference amplifier and the respective stage amplifiers can commonly use the matching circuits, a total number of electronic components can be reduced, and the power amplifier modules can be made in small dimensions and also in low cost.

What is claimed is:

1. A CDMA system comprising a power amplifier module, said power amplifier module comprising:
    a DC current amplifier to detect a DC component of an input signal and to amplify the detected DC component of the input signal; and
    an amplifier to which the current amplified by said DC current amplifier is supplied as an input current,
    wherein the input signal supplied to said DC current amplifier changes in response to an input power level.

2. The CDMA system as claimed in claim 1,
    wherein said power amplifier module is arranged in such a manner that a power supply current is detected and amplified by the DC current amplifier, and
    wherein said amplified power supply current is supplied to an input terminal of said amplifier.

3. The CDMA system as claimed in claim 1,
    wherein the amplifier and the DC current amplifier comprise a unit amplifier, and
    wherein said power amplifier module is formed by connecting plural stages of said unit amplifiers.

4. The CDMA system as claimed in claim 1,
    wherein an input terminal of said amplifier is connected to an input matching circuit.

5. The CDMA system as claimed in claim 4,
    wherein an output terminal of said amplifier is connected to an output matching circuit.

6. The CDMA system as claimed in claim 1,
    wherein an input terminal of said amplifier is connected to an interstage matching circuit, and
    wherein the interstage matching circuit is electrically connected to an input matching circuit.

7. The CDMA system as claimed in claim 1,
    wherein said amplifier includes a plurality of unit amplifiers electrically connected to each other, and
    wherein each of said unit amplifiers is supplied with a current from said DC current amplifier.

8. The CDMA system as claimed in claim 1,
    wherein said amplifier and said DC current amplifier are comprised of bipolar transistors.

9. The CDMA system as claimed in claim 8,
    wherein a bipolar transistor for constituting said amplifier is formed on a semiconductor chip in an Integrated circuit form.

10. The CDMA system as claimed in claim 8,
    wherein a bipolar transistor which constitutes said amplifier is comprised of either a GaAs-HBT or a GaAs field-effect transistor, and
    wherein said DC current amplifier is comprised of either an Si bipolar transistor or an Si field-effect transistor.

11. A CDMA system comprising a power amplifier module comprising:
    an amplifier using a field-effect transistor; and
    a DC current amplifier,
    wherein a gate voltage of said field-effect transistor is controlled by an output current of said DC current amplifier.

12. The CDMA system as claimed in claim 11,
    wherein said field-effect transistor is formed on a semiconductor chip in an integral circuit form.

* * * * *